Nov. 21, 1967 M. BELASCO ET AL 3,354,365

ALLOY CONTACT CONTAINING ALUMINUM AND TIN

Filed Oct. 29, 1964

Melvin Belasco
David D. Martin
INVENTORS

BY John G. Graham
ATTORNEY

United States Patent Office 3,354,365
Patented Nov. 21, 1967

3,354,365

ALLOY CONTACT CONTAINING ALUMINUM AND TIN

Melvin Belasco, Dallas, and David Dexter Martin, Richardson, Tex., assignors to Texas Instruments Incorporated, Dallas, Tex., a corporation of Delaware Filed Oct. 29, 1964, Ser. No. 407,433
6 Claims. (Cl. 317—237)

Figure 1:
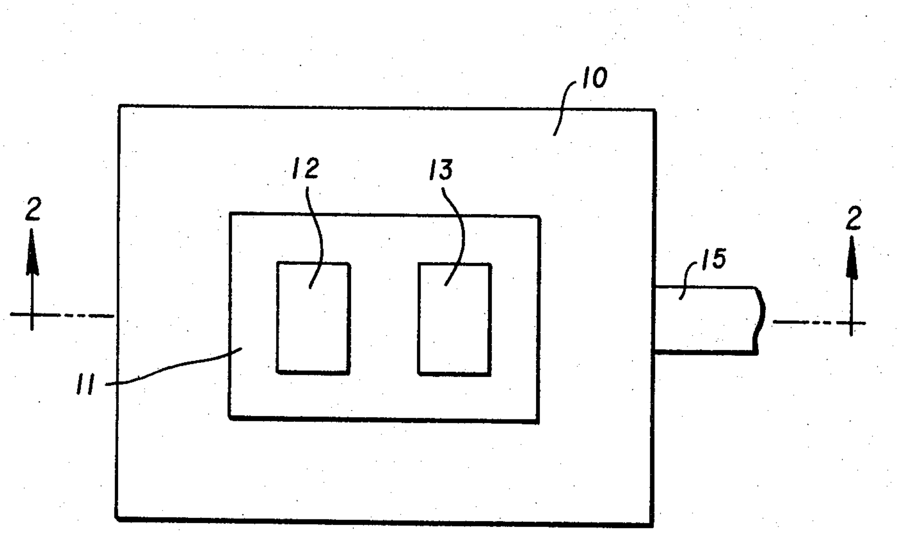

This invention relates to contact materials for semiconductor devices, such as transistors, and more particularly to alloys used for the formation of the emitter of an N–P–N Group III–V compound transistor, and more specifically a gallium arsenide transistor.

One way of specifying the quality or figure of merit of a transistor is by stating the fraction of the emitter current which becomes collector current. This fraction is called the current multiplication factor, alpha ($\alpha$). When a transistor is connected with the input signal in the base circuit in a common emitter arrangement, the current gain, beta ($\beta$), is the ratio of the collector current to the base current and is commonly expressed by the general formula $$\alpha/1-\alpha=\beta$$

Since alpha is a measure of emitter current which crosses the collector junction, it will be seen that alpha is a product of at least three factors: (1) emitter efficiency (sometimes called injection efficiency), (2) base transport efficiency, and (3) collector efficiency. It will be understood that since each of these factors is expressed in terms of efficiency, they can never have a value greater than unity. Consequently, alpha, being a product of these three fractions, can be no higher than the lowest of the three efficiencies.

Copending application, Serial No. 386,862, now Patent No. 3,314,830, entitled "Semiconductor Contact Alloy," filed August 3, 1964, in the names of Wava M. Abercrombie and Ernest C. Wurst, Jr. and assigned to the assignee of the instant application, describes an alloy of tin and indium which is used as an emitter alloy to provide a gallium arsenide transistor with a high emitter efficiency. The present invention constitutes an improvement over the above-identified copending application in that it provides a transistor emitter alloy which not only produces an advantageously high emitter efficiency, but may be easily deposited by evaporation, thus utilizing the advantages of evaporated-stripe transistor geometries.

Briefly, the present invention relates to a novel transistor emitter alloy containing aluminum and tin, which may be deposited upon a semiconductor substrate in any desired geometrical configuration by evaporation and, when alloyed to a thin P-type layer on an N-type wafer, particularly of N-type gallium arsenide, produces an N-type transistor emitter region and thus a gallium arsenide transistor with an advantageously high emitter efficiency.

It is therefore an object of the present invention to provide an improved transistor emitter contact material.

It is also an object of the invention to provide an N–P–N gallium arsenide transistor having a high emitter efficiency.

It is a further object of this invention to provide a gallium arsenide transistor with a high current multiplication factor.

It is yet a further object of this invention to provide a gallium arsenide transistor having a novel emitter contact and improved emitter efficiency.

Another object of the invention is to provide an emitter alloy which may be deposited by evaporation upon a semiconductor substrate in any desired geometry or configuration.

Yet another object of the invention is to provide an evaporated-stripe gallium arsenide transistor with a high current multiplication factor.

Figure 2:
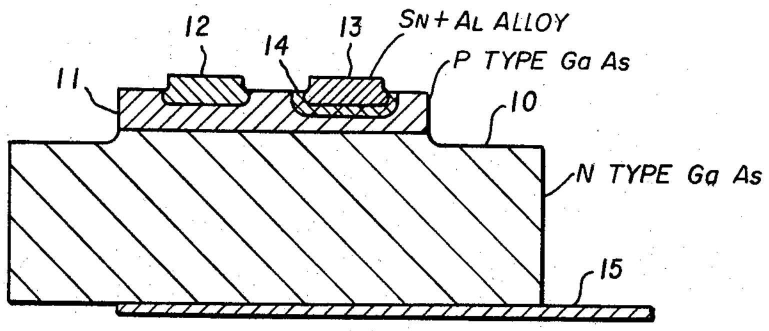

These and other objects, features, and advantages will become more readily understood from the following detailed description taken in conjunction with the appended claims and attached drawing in which:

FIGURE 1 is a top plan view of a mesa transistor embodying the principles of the present invention, and FIGURE 2 is a sectional view of the transistor of FIGURE 1 taken through the line 2—2.

The transistor illustrated in FIGURES 1 and 2 comprises a wafer 10 of N-type single crystal gallium arsenide having a P-type layer 11 formed on its upper surfaces, for example by diffusion, and etched to form a mesa of P-type material. An ohmic contact to P-type mesa 11 is provided by an evaporated stripe contact 12 of material suitable for forming ohmic contact to P-type gallium arsenide, for example, an alloy of gold and zinc.

An emitter alloy 13, containing tin (which is an N-type dopant) and aluminum in trace amounts as hereinafter described, is deposited by evaporation on the top surface of P-type layer 11 in the desired geometry. When the wafer 10 is heated, the emitter contact 13 alloys with the P-type layer 11 to form an N-type regrowth region 14. A suitable ohmic contact 15, for example platinum, is attached and electrically connected to the opposite surface of the wafer 10. It will be understood that in the transistor shown and described, wafer 10 constitutes the collector, P-type layer 11 constitutes the base, and regrowth region 14 forms the emitter.

With the exception of the emitter alloy, the above-described gallium arsenide transistor is representative of known compound semiconductor transistors. Hence the conventional processes for making such devices, which include the necessary steps of etching, cleaning, and diffusing, have been omitted as they form no part of this invention.

In the conventional N–P–N gallium arsenide transistor, the emitter is formed by alloying a contact material which contains N-type impurities to the P-type layer 11. A conventional N-type impurity used for this purpose is tin, which acts as an electron donor in gallium arsenide and therefore may be used as the emitter contact. However, transistors produced using this conventional N-type impurity consistently exhibit low values of common emitter current gain ($\beta$) which are generally attributed to poor emitter efficiency.

It is well known that a low ratio of area-to-periphery of the emitter-base junction advantageously improves the current gain ($\beta$) and reduces base resistance ($r_b'$). Accordingly, contact alloys which can be evaporated through a mask onto the surface of the base layer may be advantageously deposited in any desired geometrical configuration to attain any desired area-to-periphery ratio. Among the other advantages of evaporated contacts are the reproducibility of evaporated configurations, and the ability to simultaneously deposit multiple emitter contacts in a single operation. It has also been found that wires are more easily connected to evaporated stripes than to spherical dots, and the connections are more rigid. Furthermore, the size and shape of the alloy dot adversely affects the characteristics of the regrowth region, while evaporated deposits can be formed uniformly to any desired thickness. Accordingly, more uniform regrowth regions are obtained when evaporated contacts are used than when alloy dots are used.

The above-referenced copending application of Abercrombie and Wurst discloses that alloys containing both tin and indium produce surprisingly high emitter efficiency contacts. However, the tin-indium alloy cannot be evaporated, but must be used in individual dot form. Thus the above-described advantages of evaporated-stripe geometry have not heretofore been available for gallium arsenide transistors since the high emitter efficiency materials could not be evaporated.

Attempts to obtain both advantageous results (i.e. high emitter efficiency and low area-to-periphery ratio) by evaporating alloys of tin and indium have been unsuccessful, largely due to the difference in vapor pressures of the two metals at evaporation temperatures. When the alloys are heated, the metal having the higher vapor pressure evaporates first leaving the metal with the lower vapor pressure behind. Consequently, the evaporated deposit is not an alloy of the composition desired, but is mostly metal of the higher vapor pressure. This is particularly a problem with the tin-indium alloy, since at 1500° C. the vapor pressure of tin is approximately $3 \times 10^{-4}$ atmosphere while the vapor pressure of indium is approximately $3 \times 10^{-2}$ atmosphere.

It has been discovered that alloys of tin and aluminum, having similar vapor pressures at 1500° C.

$$(P°Sn=3 \times 10^{-4} \text{ atm.}, P°Al=1 \times 10^{-3} \text{ atm.})$$

provide the desired improved emitter efficiency known to be characteristic of tin-indium alloys as well as being easily evaporated in the desired composition. The fact that tin-aluminum alloys provide rectifying contacts to P-type gallium arsenide is completely unexpected in view of the prior art (U.S. Patent No. 3,144,088 issued to Wava M. Abercrombie) which shows aluminum to be a rectifying contact to N-type gallium arsenide. Applicants know of no explanation of this phenomenon, but it may be assumed that since only the composition of the emitter alloy has been changed, the aluminum advantageously improves the emitter efficiency.

Gallium arsenide transistors having the desired improved emitter efficiency characteristics have been made according to the hereinafter described method.

EXAMPLE 1

An epitaxial deposit of N-type gallium arsenide was formed on a monocrystalline slice of N+ gallium arsenide to produce a gallium arsenide slice having an N on N+ structure, The slice was sealed in an evacuated quartz ampule containing 0.5 milligram each of magnesium and arsenic. The ampule was then placed in a furnace and maintained at 1100° C. for 75 minutes. This process is well known in the art as closed tube diffusion and produced a P-type diffused layer on the surface of the N-type gallium arsenide. Part of the P-type diffused layer was then removed leaving a P-type diffused layer only about 2 microns thick.

A nickel mask having a plurality of rectangular holes 1.5 x 5.0 mils therein was placed on the surface of the gallium arsenide slice adjacent the P-type diffused layer. The masked slice was then mounted in a conventional vacuum evaporation apparatus. Approximately 300 milligrams of an alloy of tin-aluminum (98% Sn 2% Al) was placed on the evaporation filament of the vacuum evaporation apparatus and evaporated onto the P-type surface of the gallium arsenide slice through the rectangular holes in the nickel mask, thus forming a pattern of rectangular deposits of an alloy of tin with 2% aluminum on the surface of the gallium arsenide slice. The nickel mask was then moved laterally 1.5 mils thereby exposing another series of rectangular portions of the gallium arsenide surface. The evaporation process was repeated using a charge of gold-zinc (AuZn) alloy. The AuZn alloy used contained 95% gold and 5% zinc by weight and was used to form an ohmic contact to the P-type surface of the gallium arsenide wafer. The slice was then coated with a film of silicon oxide and placed in a furnace and maintained at 950° C. for approximately 30 minutes. The silicon oxide coating was used to prevent the zinc from diffusing out of the AuZn alloy and contaminating the emitter alloy and to prevent decomposition of the gallium arsenide surface. During this heating cycle the AuZn alloyed with the P-type layer to form an ohmic base contact and the tin-aluminum alloy formed an N-doped regrowth region in the P-type layer, thus providing a rectifying junction.

The protective coating of silicon oxide was then removed with hydrofluoric acid. The gallium arsenide slice was scribed and cleaved into individual transistor wafers each having one base stripe and one emitter stripe alloyed thereto. By appropriate masking and etching, the P-type surface of each wafer was etched to form a mesa approximately 6 x 7 mils as shown in FIGURE 2. A suitable ohmic contact such as platinum was then attached to the N+ side of the wafer. Contact to the emitter and base regions was made by thermal-compression bonding one end of a gold wire to each evaporated strip and the other end to a suitable header contact.

Gallium arsenide transistors fabricated in the manner described above exhibited current gains up to 10 and frequency capabilities in excess of 100 megacycles per second.

As another example illustrating this invention, it has been determined that similar advantageous results are also obtained when the emitter alloy contained as little as 0.2% aluminum and as much as 4% aluminum by weight. Thus, it has been shown that this invention provides an emitter alloy which advantageously improves the electrical characteristics of N–P–N gallium arsenide transistors and which may also be evaporated to utilize the particular advantages of evaporated-stripe transistor configurations.

It is to be understood that other suitable methods may be used to form the P-type base region such as diffusion with other known acceptors, i.e. zinc, manganese, cadmium or copper, or by epitaxial deposition of P-doped layers.

It is to be understood that the form of this invention, herewith shown and described, is to be taken as a preferred example of the same and that various changes may be resorted to without departing from the spirit and scope of the invention as defined by the appended claims.

What is claimed is:

1. An N-P-N gallium arsenide transistor comprising a body of gallium arsenide defining contiguous N- and P-type regions, a rectifying electrode alloyed to said P-type region consisting essentially of tin and a trace amount of aluminum, and ohmic connections attached to said N- and P-type regions.

2. In an N-P-N gallium arsenide transistor including a P-type conductivity region, a rectifying contact alloyed with a portion of said P-type conductivity region, said rectifying contact comprising an alloy consisting essentially of tin and a trace amount of aluminum.

3. A gallium arsenide transistor including a P-type conductivity region, a rectifying contact alloyed with a portion of said P-type conductivity region, said rectifying contact comprising an alloy consisting essentially of tin and about 0.2% to about 4.0% by weight of aluminum.

4. A gallium arsenide transistor comprising a body of gallium arsenide having contiguous N- and P-type conductivity regions, a rectifying contact alloyed to said P-type conductivity region, said rectifying contact comprising an alloy consisting essentially of tin and a trace amount of aluminum, and an ohmic contact electrically connected and attached to each of said P- and N-type contiguous regions.

5. In an N-P-N gallium arsenide transistor comprising a body of gallium arsenide defining contiguous N- and P-type regions and having a rectifying contact alloyed to said P-type region forming an N-type conductivity region therein, the improvement wherein said rectifying contact is an alloy consisting essentially of tin and a trace amount of aluminum.

6. The improvement defined in claim 5 wherein said trace amount of aluminum comprises about 0.2% to about 4.0% of said alloy by weight.

References Cited

UNITED STATES PATENTS

| | | | |
|---|---|---|---|
| 2,805,370 | 9/1957 | Wilson | 317—240 |
| 2,979,428 | 4/1961 | Jenny et al. | 317—237 X |
| 2,984,775 | 5/1961 | Matlow et al. | 317—240 |
| 3,041,508 | 6/1962 | Henkel et al. | 317—234 |
| 3,078,397 | 2/1963 | Tommers et al. | 317—235 |
| 3,110,849 | 11/1963 | Soltys | 317—237 |
| 3,114,088 | 12/1963 | Abercrombie | 317—237 |
| 3,202,489 | 8/1965 | Bender et al. | 317—234 X |
| 3,216,871 | 11/1965 | Kooi et al. | 317—234 X |
| 3,249,829 | 5/1966 | Everett et al. | 317—234 |

JOHN W. HUCKERT, *Primary Examiner.*

A. M. LESNIAK, *Assistant Examiner.*